US006737931B2

(12) United States Patent
Amparan et al.

(10) Patent No.: US 6,737,931 B2
(45) Date of Patent: May 18, 2004

(54) DEVICE INTERCONNECTS AND METHODS OF MAKING THE SAME

(75) Inventors: Alfonso Benjamin Amparan, Fort Collins, CO (US); David Lee Gines, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/199,596

(22) Filed: Jul. 19, 2002

(65) Prior Publication Data

US 2004/0012458 A1 Jan. 22, 2004

(51) Int. Cl.7 .................................................. H03H 7/38

(52) U.S. Cl. ......................... 333/34; 333/246; 333/247; 333/260

(58) Field of Search .......................... 333/34, 246, 247, 333/260; 257/664, 728; 343/700 MS

(56) References Cited

U.S. PATENT DOCUMENTS

| | | | | | |
|---|---|---|---|---|---|
| 5,200,719 | A | | 4/1993 | Margulis et al. | |
| 5,208,697 | A | | 5/1993 | Schaffner et al. | |
| 5,256,996 | A | | 10/1993 | Marsland et al. | |
| 5,307,237 | A | * | 4/1994 | Walz | 361/718 |
| 5,352,994 | A | | 10/1994 | Black et al. | |
| 5,729,378 | A | | 3/1998 | Tanaka et al. | |
| 5,761,350 | A | | 6/1998 | Koh | |
| 5,866,948 | A | * | 2/1999 | Murakami et al. | 257/778 |
| 5,936,492 | A | * | 8/1999 | Shingyoji et al. | 333/246 |
| 5,986,331 | A | | 11/1999 | Letavic et al. | |
| 6,028,348 | A | * | 2/2000 | Hill | 257/666 |
| 6,031,292 | A | * | 2/2000 | Murakami et al. | 257/778 |
| 6,163,069 | A | * | 12/2000 | Oohira et al. | 257/684 |
| 6,241,143 | B1 | | 6/2001 | Kuroda | |
| 6,259,335 | B1 | * | 7/2001 | Ingram et al. | 333/128 |
| 6,294,966 | B1 | * | 9/2001 | Huang et al. | 333/33 |
| 6,331,806 | B1 | * | 12/2001 | Shingyoji et al. | 333/33 |
| 6,388,326 | B2 | | 5/2002 | Liu et al. | |
| 6,388,331 | B1 | | 5/2002 | Bond et al. | |
| 6,426,686 | B1 | * | 7/2002 | Douriet et al. | 333/34 |
| 6,441,697 | B1 | * | 8/2002 | Garland et al. | 333/34 |
| 6,469,383 | B1 | * | 10/2002 | Welstand | 257/737 |

OTHER PUBLICATIONS

K. W. Goossen, "On the design of coplanar bond wires as transmission lines," IEEE Microwave and Guided Wave Letters, vol. 9, No. 12, pp. 511–513, Dec. 1999.

M. C. R. Carvalho et al., "A new, small–sized transmission line impedance transformer, with applications in high–speed optoelectronics," IEEE Microwave and Guided Wave Letters, vol. 9, No. 12, pp. 428–430, Nov. 1992.

M. C. R. Carvalho et al., "A transmission line transformer," Electron Lett., vol. 27, pp. 138–139, 1991.

* cited by examiner

*Primary Examiner*—Michael J. Tokar
*Assistant Examiner*—Khai Nguyen

(57) ABSTRACT

Device interconnects and methods of making the same are described. In one aspect, a device interconnect system includes a bonding pad portion and a transmission line portion. The bonding pad portion is disposed on a device substrate and is constructed and arranged for electrical connection to a bond wire. The transmission line portion is disposed on the device substrate and is constructed and arranged to electrically couple the bonding pad portion to a device formed on the device substrate. The transmission line portion has a width dimension that is substantially parallel to the device substrate and a height dimension that is substantially perpendicular to the device substrate. The width dimension and the height dimension of the transmission line portion both vary from the bonding pad portion to the device.

26 Claims, 3 Drawing Sheets

DEVICE INTERCONNECTS AND METHODS OF MAKING THE SAME

BACKGROUND

In high speed optoelectronic applications, such as optical communications, optoelectronic devices (e.g., PIN photodiodes, semiconductor lasers, and integrated optical modulators) typically have low input resistance (e.g., on the order of 5–20 ohms). However, these devices typically are driven by 50 ohm microwave sources. The resulting impedance mismatch between the source and the optoelectronic device limits the system bandwidth and reduces the power coupling efficiency between the source and the optoelectronic device, making it difficult to generate the short optical pulses (e.g., pulses on the order of $10^{-12}$ to $10^{-15}$ seconds in width) that typically are needed for high speed operation.

The impedance mismatch problem in microwave circuits typically is solved by incorporating an impedance matching transformer between the source and the optoelectronic device. Among common microwave impedance matching transformers are single- and double-tuned stubs, lumped element transformers, and tapered line transformers. Planar tapered line transformers typically are characterized by a relatively large bandwidth, whereas other kinds of transformers typically are tuned to a specific frequency. In a planar tapered line transformer, an impedance match typically is achieved by varying the width of the signal carrying conductor (i.e., the electrode) relative to the ground plane, while maintaining a constant height along the length of the transformer. Typically, the width of the electrode is varied to continuously adjust the characteristic impedance of the transformer as a function of position along the length of the transformer.

In some optoelectronic systems, in addition to the impedance mismatch between the source and the optoelectronic device, system bandwidth often is limited by parasitic capacitance that is introduced by the bonding pad and by parasitic inductance that is introduced by the bonding wire that is attached to the bonding pad. A relatively large bonding pad typically is used to achieve good adhesion of the pad to the supporting substrate and the bonding wire. For example, a typical bonding pad has an area that is on the order of 50 micrometers by 50 micrometers. Such a large bonding pad size, however, typically results in a relatively large capacitance that may limit the bandwidth of the system and may increase the impedance mismatch to the source.

A typical approach to reducing the impact of the bonding pad and bonding wire on system performance is to reduce the parasitic capacitance of the bonding pad (e.g., by using a thick layer of a low dielectric constant material, such as polyamide) and to reduce the length of the bonding wire to reduce the parasitic inductance.

In another approach, the bonding wires are constructed to operate as transmission lines and the bonding pad is impedance-matched to the source. In this approach, the size of the bonding pad structures and the length of the bonding wires are not limiting factors because the parasitic capacitance and parasitic inductance do not impact system performance. The resulting structures in this approach, however, typically are much larger than the optoelectronic device, making it difficult to construct an impedance matching circuit between the is bonding pad and the optoelectronic device.

SUMMARY

In one aspect, the invention features a device interconnect system that includes a bonding pad portion and a transmission line portion. The bonding pad portion is disposed on a device substrate and is constructed and arranged for electrical connection to a bond wire. The transmission line portion is disposed on the device substrate and is constructed and arranged to electrically couple the bonding pad portion to a device formed on the device substrate. The transmission line portion has a width dimension that is substantially parallel to the device substrate and a height dimension that is substantially perpendicular to the device substrate. The width dimension and the height dimension of the transmission line portion both vary from the bonding pad portion to the device.

In another aspect, the invention features a method of making the above-described device interconnect system.

Among the advantages of the invention are the following.

The invention enables the characteristic impedance to change continuously from the bonding pad portion to the device, resulting in high coupling efficiency and low insertion loss. The invention also enables reflections at the bonding pad portion and the device to be reduced because the transmission line portion may be optimized for both structures, which may have different heights. In addition, the invention enables the overall length of the transmission line portion to be reduced for a given bandwidth because both the height and width dimensions may be varied to achieve a prescribed impedance variation from the bonding pad portion to the device.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1A:
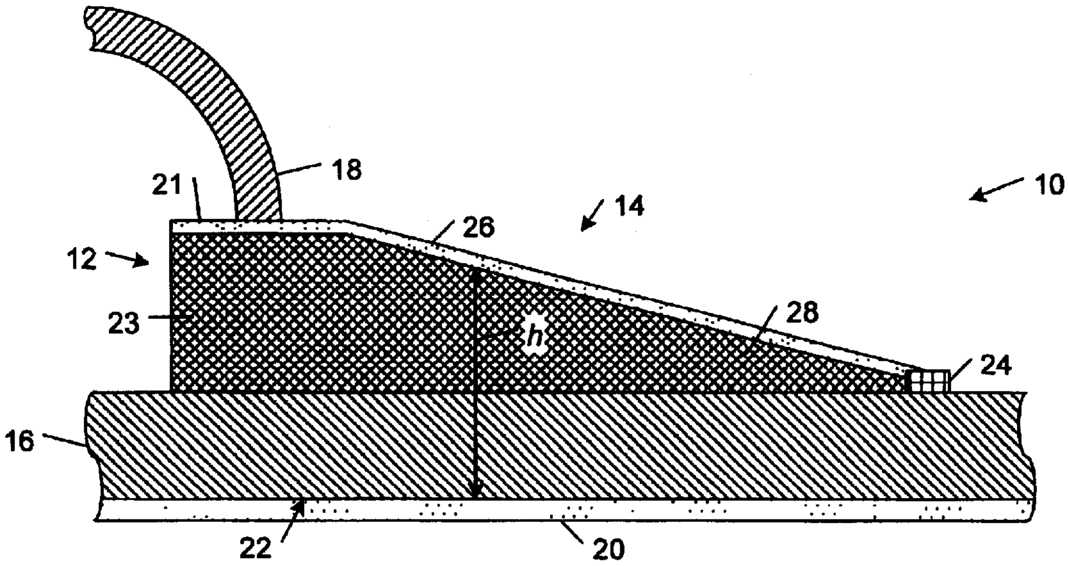
FIG. 1A is a diagrammatic cross-sectional side view of a device interconnect system that is disposed on a device substrate and includes a bonding pad portion and a transmission line portion.
Figure 1B:
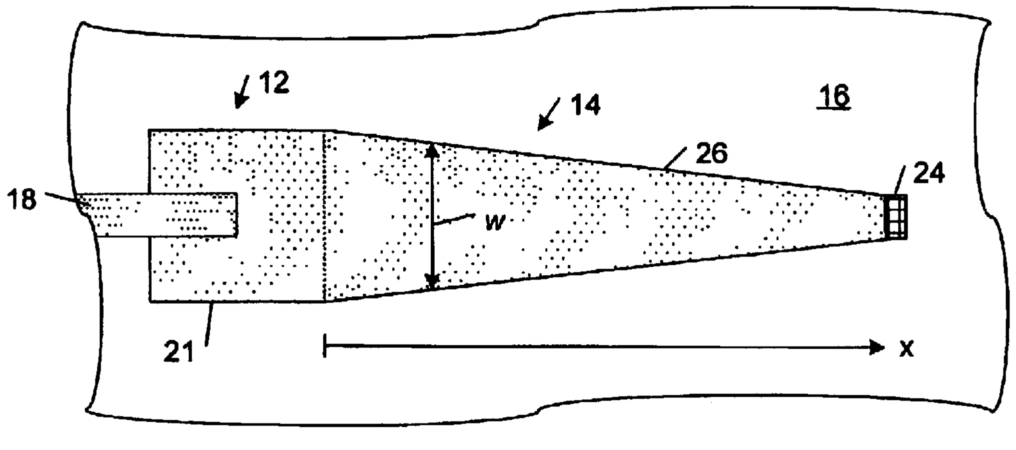
FIG. 1B is a diagrammatic top view of the device interconnect system of FIG. 1A.

Referring to FIGS. 1A and 1B, in one embodiment, a device interconnect system 10 includes a bonding pad portion 12 and a transmission line portion 14 that are disposed on a device substrate 16. A ground plane 20 is formed on a bottom surface 22 of substrate 16. The bonding pad portion 12 includes an electrically conducting pad 21 that is constructed and arranged for electrical connection to a bonding wire 18 and preferably has a relatively large exposed area to improve the ability to attach bonding wire 18 during manufacture. The bonding pad portion 12 also includes the material of substrate 16 and an electrically insulating support structure 23 that is disposed between pad 21 and ground plane 20. The support structure 23 may be a unitary or layered structure. The bonding pad portion 12 and the ground plane 20 form a transmission line structure that preferably has an impedance that matches a selected source impedance (e.g., 50 ohms). The transmission line portion 14 is constructed and arranged to electrically couple the bonding pad portion 12 to a device 24 (e.g., a high-speed device, such as an optoelectronic device) that is disposed on the device substrate 16. In the illustrated embodiment, the transmission line portion 14 is implemented as a microstrip transmission line structure that includes an electrode 26, ground plane 20, and the material of substrate 16 and a support substrate 28 that is disposed between electrode 26 and ground plane 20. The support substrate 28 may be a unitary or layered structure and may be integral with support structure 23, as shown in FIG. 1A. In some embodiments, bonding pad portion 12 and transmission line portion 14 are formed integrally with device 24 on device substrate 16 using a conventional microwave circuit fabrication process.

Device 24 may be any kind of device, including any kind of electronic, opto-electronic, or electro-optic device. Substrate 16 may be any suitable substrate material on which device 24 may be formed, including a semiconductor material (e.g., Group IV semiconductors such as silicon and germanium; Group III–V semiconductors such as gallium arsenide and indium phosphide; Group II–VI semiconductors; and polysilicon), an oxide material (e.g., silicon dioxide, magnesium oxide, and indium-tin-oxide), sapphire, glass, a single semiconductor layer (e.g., silicon nitride), a multilayer structure that includes, for example, a semiconductor device (e.g., a light-emitting diode, a semiconductor laser, and an electronic device), polymeric resins (e.g., polyamide), and ceramics. Ground plane 20 preferably is formed from an electrically conducting material, such as a metal. Electrode 26 preferably is formed from an electrically conducting material, such as a metal, and may be integral with electrically conducting pad 21, as shown in FIG. 1A. Support structures 23 and 28 may be formed from any suitable dielectric materials, including semiconductors (e.g., indium phosphide), oxide materials (e.g., silicon dioxide), and polymeric resins (e.g., polyamide).

As shown in FIGS. 1A and 1B, the transmission line portion 14 has a width dimension (w) that is substantially parallel to the device substrate 16 and a height dimension (h) that is substantially perpendicular to the device substrate 16 and corresponds to the distance separating electrode 26 and ground plane 20. The width dimension (w) and the height dimension (h) of the transmission line portion 14 both vary from the bonding pad portion 12 to the device 24. In some embodiments, the height dimension (h) and the width dimension (w) of the transmission line portion 14 vary in a manner accommodating impedance mismatch between the bonding pad portion 12 and the device 24. For example, the width dimension (w) and the height dimension (h) may vary to achieve a prescribed impedance profile along the transmission line portion 14, from the bonding pad portion 12 to the device 24. The prescribed impedance profile may optimize bandwidth, power loss, or both. In some embodiments, the prescribed impedance profile may be a linear profile, an exponential profile, or a Chebyshev profile. The height dimension (h) of the transmission line portion 14 also may vary in a manner accommodating the height mismatch between the bonding pad portion 12 and the device 24. As explained in detail below, in some embodiments, the width and height dimensions (w, h) of the transmission line portion 14 may vary from the bonding pad portion 12 to the device 24 to achieve an impedance matching transmission line portion that has one end with a similar height and width as the bonding pad portion 12 and another end with a similar height and width as the device 24.

In some embodiments, the width and height dimensions (w, h) of the transmission line portion 14 may be selected as follows. The impedance (Z(x)) of the transmission line portion 14 varies as function of distance (x) from the bonding pad portion 12 in accordance with equation (1).

$$Z(x) = \sqrt{\frac{L(x)}{C(x)}} \tag{1}$$

where L(x) is the inductance and C(x) is the capacitance expressed as functions of distance (x) from the bonding pad portion 12. The capacitance C(x) varies with the height and width dimensions in accordance with equation (2).

$$C(x) = \frac{\varepsilon w(x)}{h(x)} \tag{2}$$

where h(x) and w(x) are the height and width dimensions of the transmission line portion 14 expressed as functions of distance (x) from the bonding pad portion 12, and $\epsilon$ is the effective electric permittivity of the dielectric material disposed between electrode 26 and ground plane 20. Thus, the capacitance at a given location along the length of the transmission line portion 14 is proportional to the width dimension (w) at the given location divided by the height dimension (h) at the given location. The inductance along the length of the transmission line portion 14 typically is constant. By substituting the expression for C(x) in equation (2) into equation (1), the impedance Z(x) may be expressed in terms of the width and height dimensions (w(x), h(x)) as shown in equation (3).

$$Z(x) = \sqrt{\frac{Lh(x)}{w(x)\varepsilon}} \tag{3}$$

where the inductance L(x) is assumed for illustrative purposes to be a constant L.

Equation (3) may be rearranged to obtain expressions for the width dimension (w(x)) and the height dimension (h(x)), as shown in equations (4) and (5).

$$w(x) = \frac{h(x)\varepsilon}{LZ^2(x)} \tag{4}$$

$$h(x) = \frac{w(x)\varepsilon}{LZ^2(x)} \tag{5}$$

Equations (4) and (5) may be used to compute the width and height profiles (w(x), h(x)) of transmission line portion 14, from the bonding pad portion 12 to the device 24, as explained in detail below.

Figure 2:
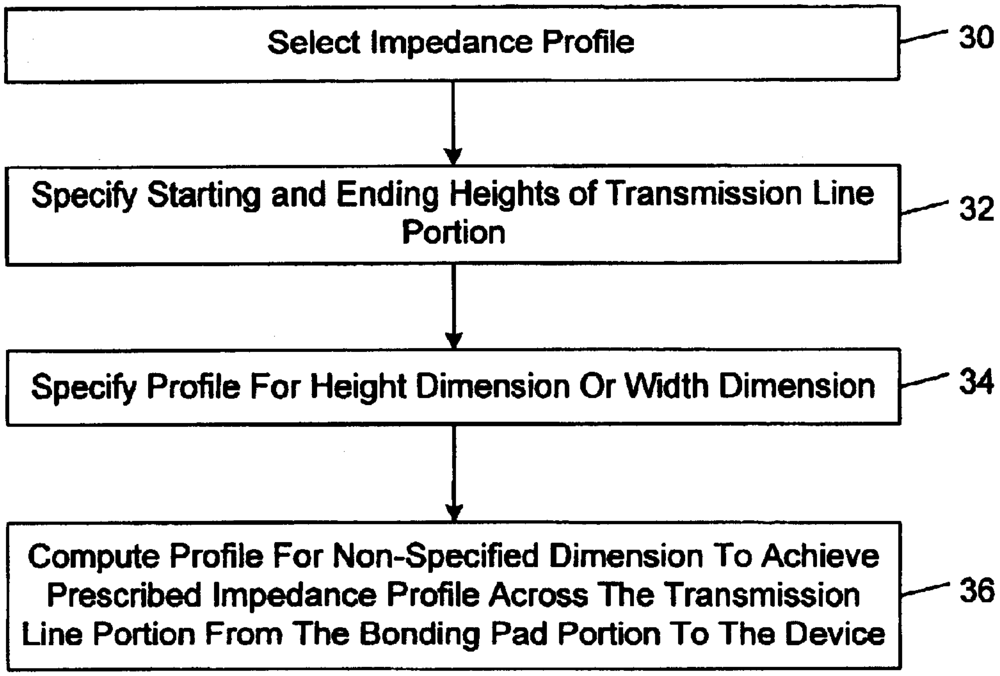
FIG. 2 is a flow diagram of a method of making the device interconnect system of FIGS. 1A and 1B.

Referring to FIG. 2, in some embodiments, the width and height profiles (w(x), h(x)) of transmission line portion 14 may be computed as follows. An impedance profile (Z(x)) for the transmission line portion 14 is selected (step 30). The impedance profile may correspond to any one of a wide variety of different impedance profiles, including linear, exponential, and Chebyshev tapered profiles. The selected impedance profile may optimize certain performance characteristics of the transmission line portion 14, such as bandwidth or power loss, or both. In one illustrative example, a linear taper for Z(x) might be written as $$Z(x) = x \cdot \frac{Z_1 - Z_0}{d} + Z_0 \tag{6}$$

where $Z_0$ is the impedance at the bonding pad portion 12, $Z_1$ is the impedance at the device 24, and d is the length of the transmission line portion 14. The heights at the starting and ending points of the transmission line portion 14 are specified (step 32). As mentioned above, in some embodiments, the height of transmission line portion 14 at the bonding pad portion may substantially match the corresponding height of bonding pad portion 12, and the height of transmission line portion 14 at device 24 may substantially match the corresponding height of device 24. By accommodating the height mismatch between the bonding pad portion 12 and device 24 in these embodiments, reflections at the bonding pad portion 12 and the device 24 may be reduced. In some of these embodiments, the width of transmission line portion 14 at bonding pad portion 12 may substantially match the corresponding width of bonding pad portion 12, and the width of transmission line portion 14 at device 24 may substantially match the corresponding width of device 24.

Figure 3:
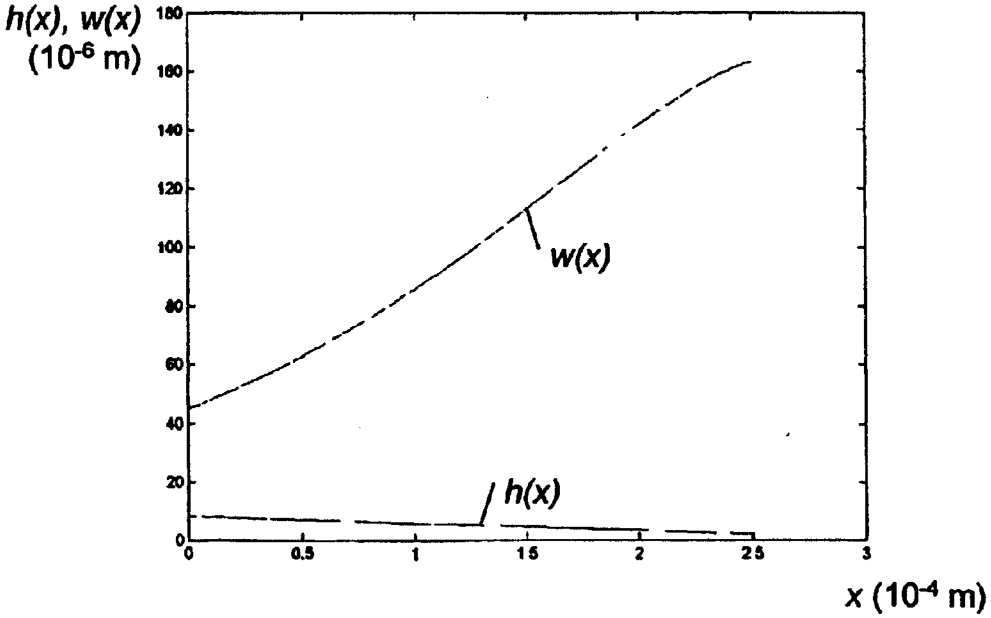
FIG. 3 is a graph of simulated height and width dimensions (h(x), w(x)) of a transmission line portion plotted as a function of distance (x) from the bonding pad portion of FIGS. 1A and 1B.

A profile for one of the height dimension (h(x)) or the width dimension (w(x)) is specified as a function of the distance (x) from the bonding pad portion 12 (step 34). In general, the specified profile may correspond to any shape, although the set of possible profiles may be limited by the material and fabrication technologies that are used to manufacture device interconnect system 10. In some embodiments, a substantially linear profile may be selected for the height dimension (h(x)), as shown in FIG. 3. Next, the profile for the non-specified dimension (e.g., the width dimension in the illustrated embodiment) is computed by substituting the expression for the impedance profile and the expression for the specified dimension into equation (4) if the height dimension is specified or equation (5) if the width dimension is specified (step 36). When the height dimension changes substantially linearly along the length of the transmission line portion, as shown in FIG. 3, the resulting width dimension (w(x)) also may have a substantially linear profile with only gradual variations, increasing coupling efficiency and reducing microwave loss. By contrast, if the height dimension were constant along the length of the transmission line portion, the width dimension would require a sharp exponential taper to achieve the prescribed impedance profile, which reduces coupling efficiency and increases microwave loss.

Figure 4:
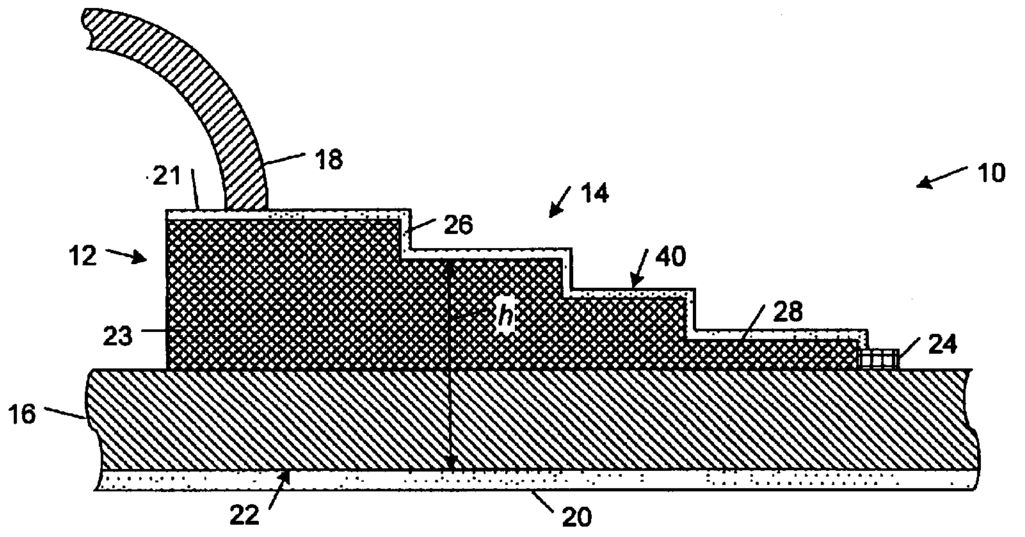
FIG. 4 is a diagrammatic cross-sectional side view of a device interconnect system that is disposed on a device substrate and includes a bonding pad portion and a stepped transmission line portion.

Referring to FIG. 4, in some embodiments, the height dimension of transmission line portion 14 may be stepped. The number and size dimensions of each step 40 may be selected to approximate a desired profile (e.g., a linear profile in the illustrated embodiment), although cost and fabrication considerations also may influence this selection. In these embodiments, the stepped height profile may be achieved by forming an electrode over a layered, electrically insulating support structure 28.

In sum, the above-described device interconnect system embodiments may be constructed and arranged to provide a continuous characteristic impedance change from the bonding pad portion 12 to the device 24, resulting in high coupling efficiency and low insertion loss. Reflections at the bonding pad portion 12 and the device 24 may be reduced by optimizing the transmission line portion 14 for both structures. In addition, for a given bandwidth, the overall length of the transmission line portion 14 may be reduced because both the height and width dimensions are varied to achieve the prescribed impedance variation from the bonding pad portion 12 to the device 24.

Other embodiments are within the scope of the claims. For example, although the above embodiments have been described in connection with a microstrip-type transmission line, other embodiments may include different kinds of transmission line impedance transformers (e.g., a coplanar waveguide impedance transformer).

The transmission line profile computation methods described herein are not limited to any particular hardware or software configuration, but rather they may be implemented in any computing or processing environment, including in digital electronic circuitry or in computer hardware, firmware, or software. These computation methods may be implemented, in part, in a computer program product tangibly embodied in a machine-readable storage device for execution by a computer processor (e.g., a general or special purpose microprocessor). Storage devices suitable for tangibly embodying computer program instructions include all forms of non-volatile memory (e.g., semiconductor memory devices, such as EPROM, EEPROM, and flash memory devices; magnetic disks such as internal hard disks and removable disks; magneto-optical disks; CD-ROM; DVD-ROM; and DVD-RAM). Any of the foregoing technologies may be supplemented by or incorporated in specially-designed ASICs (application-specific integrated circuits).

Still other embodiments are within the scope of the claims.

What is claimed is:

1. A device interconnect system, comprising:

a bonding pad portion disposed on a device substrate and including at a first elevation above the device substrate an electrical conductor constructed and arranged for electrical connection to a bond wire; and a transmission line portion disposed on the device substrate and including an electrical conductor constructed and arranged to electrically couple the electrical conductor of the bonding pad portion to a device at a second elevation above the device substrate different from the first elevation, the electrical conductor of the transmission line portion having a width dimension substantially parallel to the device substrate and a height dimension substantially perpendicular to the device substrate, wherein the width dimension and the height dimension both vary from the bonding pad portion to the device, the height dimension varying from the first elevation to the second elevation in a series of at least two steps, each step being at a respective elevation above the device substrate different from other step elevations and different from each of the first and second elevations.

2. The system of claim 1, wherein the height dimension of the transmission line portion varies in a manner accommodating height mismatch between the bonding pad portion and the device.

3. The system of claim 2, wherein the height dimension of the transmission line portion at the bonding pad portion substantially matches a corresponding height dimension of the bonding pad portion and the height dimension of the transmission line portion at the device substantially matches a corresponding height dimension of the device.

4. The system of claim 3, wherein the steps approximate a linear variation of the height dimension of the transmission line portion from the bonding pad portion to the device.

5. The system of claim 1, wherein the width dimension and the height dimension of the transmission line portion vary in a manner accommodating impedance mismatch between the bonding pad portion and the device.

6. The system of claim 5, wherein the width dimension and the height dimension of the transmission line portion vary to achieve a prescribed impedance profile across the transmission line portion from the bonding pad portion to the device.

7. The system of claim 6, wherein the prescribed impedance profile optimizes bandwidth, power loss, or both.

8. The system of claim 6, wherein the prescribed impedance profile is a linear profile, an exponential profile, or a Chebyshev profile.

9. The system of claim 6, wherein the height dimension varies substantially in accordance with a selected profile and the width dimension varies to achieve the prescribed impedance profile.

10. The system of claim 9, wherein the steps approximate a linear variation of the height dimension of the transmission line portion from the bonding pad portion to the device.

11. The system of claim 6, wherein the width dimension varies substantially in accordance with a selected profile and the height dimension varies to achieve the prescribed impedance profile.

12. The system of claim 5, wherein the height dimension of the transmission line portion varies in a manner reducing height mismatch between the bonding pad portion and the device.

13. The system of claim 12, wherein the height dimension of the transmission line portion at the bonding pad portion substantially matches a corresponding height dimension of the bonding pad portion and the height dimension of the transmission line portion at the device substantially matches a corresponding height dimension of the device.

14. The system of claim 1, wherein the transmission line portion is implemented as a microstrip transmission line or a coplanar waveguide transmission line.

15. The system of claim 1, wherein the bonding pad portion and the transmission line portion are formed integrally with the device on the device substrate.

16. The system of claim 1, wherein between the bonding pad portion and the device the transmission line portion is formed on a layered, electrically insulating support structure having a stepped height profile.

17. The system of claim 1, wherein the electrical conductors of the bonding pad portion and the transmission line portion are supported by a mutual unitary electrically insulating support structure.

18. A method of making a device interconnect system, comprising:

forming on a device substrate a bonding pad portion including at a first elevation above the device substrate an electrical conductor constructed and arranged for electrical connection to a bond wire; and forming on the device substrate a transmission line portion including an electrical conductor constructed and arranged to electrically couple the electrical conductor of the bonding pad portion to a device at a second elevation above the device substrate different from the first elevation, the electrical conductor of the transmission line portion having a width dimension substantially parallel to the device substrate and a height dimension substantially perpendicular to the device substrate, wherein the width dimension and the height dimension both vary from the bonding pad portion to the device, the height dimension varying from the first elevation to the second elevation in a series of at least two steps, each step being at a respective elevation above the device substrate different from other step elevations and different from each of the first and second elevations.

19. The method of claim 18, wherein the height dimension of the transmission line portion varies in a manner accommodating height mismatch between the bonding pad portion and the device.

20. The method of claim 18, wherein the width dimension and the height dimension of the transmission line portion vary in a manner accommodating impedance mismatch between the bonding pad portion and the device.

21. The method of claim 18, wherein the bonding pad portion and the transmission line portion are formed integrally with the device on the device substrate.

22. A device interconnect system, comprising:

a unitary electrically insulating support structure disposed on a device substrate;

a bonding pad portion disposed directly on the electrically insulating support structure and constructed and arranged for electrical connection to a bond wire; and a transmission line portion disposed directly on the electrically insulating support structure and constructed and arranged to electrically couple the bonding pad portion to a device formed on the device substrate, the transmission line portion having a width dimension substantially parallel to the device substrate and a height dimension substantially perpendicular to the device substrate, wherein the width dimension and the height dimension both vary from the bonding pad portion to the device.

23. The system of claim 22, wherein the bonding pad portion and the transmission line portion are formed by an integrated structure including a unitary layer of electrically conducting material constructed and arranged to electrically couple the bond wire to the device.

24. The system of claim 22, wherein the bonding pad portion includes at a first elevation above the device substrate an electrical conductor constructed and arranged for electrical connection to the bonding wire, the transmission line portion includes an electrical conductor constructed and arranged to electrically couple the electrical conductor of the bonding pad portion to the device at a second elevation above the device substrate, and the support structure supports the electrical conductor of the transmission line portion between the first elevation and the second elevation with the height dimension varying nonlinearly at elevations different from the first elevation and the second elevation.

25. The system of claim 21, wherein the height dimension of the electrical conductor of the transmission line portion varies from the first elevation to the second elevation in a series of at least two steps, each step being at a respective elevation above the device substrate different from other step elevations and different from each of the first and second elevations.

26. A device interconnect system, comprising:

a bonding pad portion disposed on a device substrate and including an electrical conductor at a first elevation above the device substrate constructed and arranged for electrical connection to a bond wire; and a transmission line portion disposed on the device substrate and including an electrical conductor constructed and arranged to electrically couple the electrical conductor of the bonding pad portion to a device at a second elevation above the device substrate different from the first elevation, the electrical conductor of the transmission line portion having a width dimension substantially parallel to the device substrate and a height dimension substantially perpendicular to the device substrate, wherein the width dimension and the height dimension both vary from the bonding pad portion to the device, the height dimension varying nonlinearly at elevations different from the first elevation and the second elevation.

* * * * *